United States Patent [19]

Nola

[11] 4,400,657

[45] Aug. 23, 1983

[54] TRIAC FAILURE DETECTOR

[75] Inventor: Frank J. Nola, Huntsville, Ala.

[73] Assignee: The United States of America as represented by the Administrator of the National Aeronautics and Space Administration, Washington, D.C.

[21] Appl. No.: 325,886

[22] Filed: Nov. 30, 1981

[51] Int. Cl.³ .............................................. H02P 5/40
[52] U.S. Cl. .................................... 318/798; 318/806; 318/729; 361/100; 361/90; 363/54
[58] Field of Search ........... 318/798, 806, 729, 345 D, 318/345 H; 363/52, 53, 54, 57; 361/100, 91, 92, 90, 88; 307/252 B

[56] References Cited

U.S. PATENT DOCUMENTS

| | | | |
|---|---|---|---|
| 3,737,744 | 6/1973 | Bader, Jr. | 361/113 |
| 4,025,836 | 5/1977 | Naito et al. | 318/139 |
| 4,355,343 | 10/1982 | Gross | 307/252 B |
| 4,361,793 | 11/1982 | Nordell | 318/729 |

Primary Examiner—David Smith, Jr.
Attorney, Agent, or Firm—J. H. Beumer; J. R. Manning; L. D. Wofford, Jr.

[57] ABSTRACT

A failure detector is provided for detecting unidirectional failures in triacs, particularly as used in power factor controllers for induction motors. In a first embodiment, the triac voltage waveform is sensed and upon detection of an unbalanced signal, corresponding to failure of the triac in either the positive or negative direction, the triac is turned full on in both directions. In a second embodiment, a pair of pulsed signals are derived, the pulse durations of which are proportional to the phase difference between the load current and voltage for each half cycle, and the triac is turned full on responsive to a difference in pulse duration between the half cycle signals. An unidirectional open circuit detector is adapted to use a signal from either of the first and second embodiments to turn the triac off in response to an open circuit failure in either direction.

20 Claims, 17 Drawing Figures

TRIAC FAILURE DETECTOR

ORIGIN OF THE INVENTION

This invention described herein was made by an employee of the United States Government and may be manufactured and used by or for the Government of the United States for governmental purposes and without the payment of any royalties thereon or therefor.

TECHNICAL FIELD

The present invention relates to failure detection circuits for triacs connected in triac control systems such as power factor controllers.

BACKGROUND ART

In U.S. Pat. Nos. 4,052,648 (Nola) and 4,266,177 (Nola), there are disclosed power factor control systems which are particularly useful in connection with AC induction motors and which sample the line voltage and current through the motor and control the power input to the motor in proportion to the detected phase difference between the sampled voltage and current, whereby less power is provided to the motor in response to decreased loading of the motor. The control of input power is preferably effected by controlling the time during which a control triac connected in series with the motor is turned on.

A troublesome failure mode associated with triacs is that which causes the triac to effectively short circuit in one direction only. In effect, this failure mode is equivalent to placing a diode across the triac such that the triac passes uncontrolled current in one direction but still can be controlled in the opposite direction. If this failure mode occurs in phase controlled induction motor systems such as in the power factor controller described above, the unbalanced waveform results in a d.c. current component which can produce overheating and damage to the motor.

A further failure mode for triacs that presents particular detection problems is where the triac is effectively open circuited in one direction only. As explained below the present invention is concerned with detecting if a triac has failed shorted, or failed open, in one direction only and with providing the appropriate response thereto. It will be understood that while the invention is of particular value when used in connection with power factor controllers such as described above, the invention is not limited to such a use.

SUMMARY OF THE INVENTION

Generally speaking, one major aspect of the present invention concerns the provision of circuitry which detects unidirectional short circuits in triacs and which, upon detecting such a shorted condition, turns the triac fully on. A further major aspect of the invention concerns the provision of circuitry which detects unidirectional open circuits in triacs and which, in response thereto, turns the triac off. As will appear from the discussion which follows, certain advantages accrue when the failure detection circuitry of the invention is incorporated in a power factor controller such as described above although, as stated above, the invention is not limited to such use.

In accordance with a first embodiment of the invention, the failure detector circuit basically comprises detecting means for detecting the triac voltage waveform and for producing a first output responsive to a symmetrical triac voltage waveform produced during normal triac operation and for producing a second output responsive to a non-symmetrical triac voltage waveform caused by failure of the triac in either a positive or negative direction (i.e., what is being referred to as a unidirectional failure); and control means, connected to the detecting means, for turning the triac full on in both directions responsive to the second output.

Preferably, the detecting means comprises a low pass filter, connected to receive the voltage across the triac, which produces a first filter output responsive to short circuiting of the triac in one direction and which produces a second filter output responsive to short circuiting of the triac in a second direction, and operational amplifier means connected to said low pass filter for producing the second (triac triggering) output referred to above responsive to either the first filter output or the second filter output. Advantageously, the operational amplifier means comprises an operational amplifier, a first blocking diode connected between the output and one input of the operational amplifier and a second blocking diode connected between the operational amplifier and the triac control means.

Preferably, the control means comprises an operational amplifier having one input connected to the output of the detecting means of the failure detection circuit and an output connected to the gate of the triac. Advantageously, the control means further comprises a bias circuit for providing a predetermined bias voltage at the other input of the operational amplifier, the bias voltage being related to second output such that said operational amplifier switches to a full output condition (e.g., its full negative voltage) when a predetermined relationship exists between the bias voltage and the second output (e.g., when the latter exceeds the former). The control means further comprises a latching circuit, responsive to the aforesaid switching of the operational amplifier, for latching the operational amplifier in said full output condition so as to ensure that the triac is continuously maintained fully turned on in both directions. This latching circuit preferably includes a resistor and diode connected between said bias circuit and the output of the operational amplifier.

According to a further aspect of this embodiment, the control system further comprises open circuit failure detecting means for detecting an open circuit failure of the triac in either direction and for turning off the triac in response to detection of such a failure. The open circuit failure detecting means advantageously comprises an operational amplifier, connected to receive the first and second outputs of the detecting means of the failure detection circuit, for producing an output which causes turning off of the triac, and a diode arrangement for blocking the output of the operational amplifier when the first output is received and for passing the output of the operational amplifier to the gate of the triac when said second output is received. An input low pass filter is preferably connected to the input of the operational amplifier which receives the first and second outputs of the detecting means of the short circuit failure detection circuit and a latching circuit for latching the operational amplifier in the output condition thereof which provides for turning off of the triac.

In accordance with a second embodiment thereof, the invention concerns the provision, in a triac control system for an alternating current input signal for controlling input current flow to an inductive load, of a triac failure detection circuit for detecting a unidirectional short circuit failure of the triac of the control system, the failure detecting circuit comprising phase shift detection means for deriving first and second pulse trains of phase difference pulses whose phase durations are proportional to the phase differences between the triac voltage and current for each half cycle of the alternating current signal, and detecting means for receiving the phase difference pulses and for producing a first output when the half cycle pulses are of equal duration corresponding to normal operation, and for producing a second output when the half cycle pulses are of unequal duration corresponding to a short circuit failure of the triac in either direction, and control means, connected to the detecting means, for turning the triac full on in both directions responsive to the second output.

According to a particularly advantageous form of the second embodiment, the failure detection circuit is incorporated in a power factor controller for controlling the power supplied to an induction motor in accordance with the phase difference between motor voltage and current waveforms. In this form of the invention, the phase shift detection means derives the phase difference signals from signals produced by the power factor controller. In particular, the power factor controller preferably produces first and second signals proportional the square of the load voltage and the inverse thereof, and third and fourth signals proportional to the square of the load current and the inverse thereof, and includes a summing circuit for selectively summing the signals to produce a first square wave having a pulse duration proportional to the phase shift for a positive half cycle of the input current and a second square wave having a pulse duration proportional to the phase shift for a negative half cycle of the input current. These first and second square waves correspond to the first and second pulse trains produced by the phase shift detection means.

Preferably, the detecting means includes first and second operational amplifiers for receiving one of said first and second pulse trains for first and second square waves, at each of the inputs thereof such that an output is produced when the pulses of the first and second pulse trains are of unequal duration. A blocking diode arrangement provides blocking of the outputs of a first polarity produced by either of the operational amplifiers.

The control means preferably comprises an operational amplifier having one input connected to the output of the detecting means and an output connected to the gate of the triac. The control means further comprises a bias circuit for providing a predetermined voltage at the other input of the operational amplifier so that the operational amplifier switches to a full output condition (e.g., its full negative voltage) when a predetermined relationship exists between the bias voltage and the second output. The control means further comprising a latching circuit responsive to switching of the operational amplifier for latching the operational amplifier in the full output condition so as to ensure that the triac is continuously maintained fully turned on in both directions.

Advantageously, the second embodiment of the invention also further comprises an open circuit failure detecting circuit for detecting an open circuit failure of the triac in either direction and for turning off the triac in response to detection of such a failure. This open circuit failure detection circuit is preferably of the type discussed above in connection with the first embodiment.

Other features and advantages of the invention will be set forth in, or apparent from, the detailed description of the preferred embodiments which follows.

DESCRIPTION OF THE PREFERRED EMBODIMENTS

Before considering the present invention, a power factor controller of the type disclosed in U.S. Pat. No. 4,266,177 will be considered in connection with FIG. 1 in which a failure detecting circuit in accordance with one embodiment of the invention is incorporated. The system shown in FIG. 1 is similar to that described in the patent just referred to and the subject matter of that patent is hereby incorporated by reference.

Figure 1:
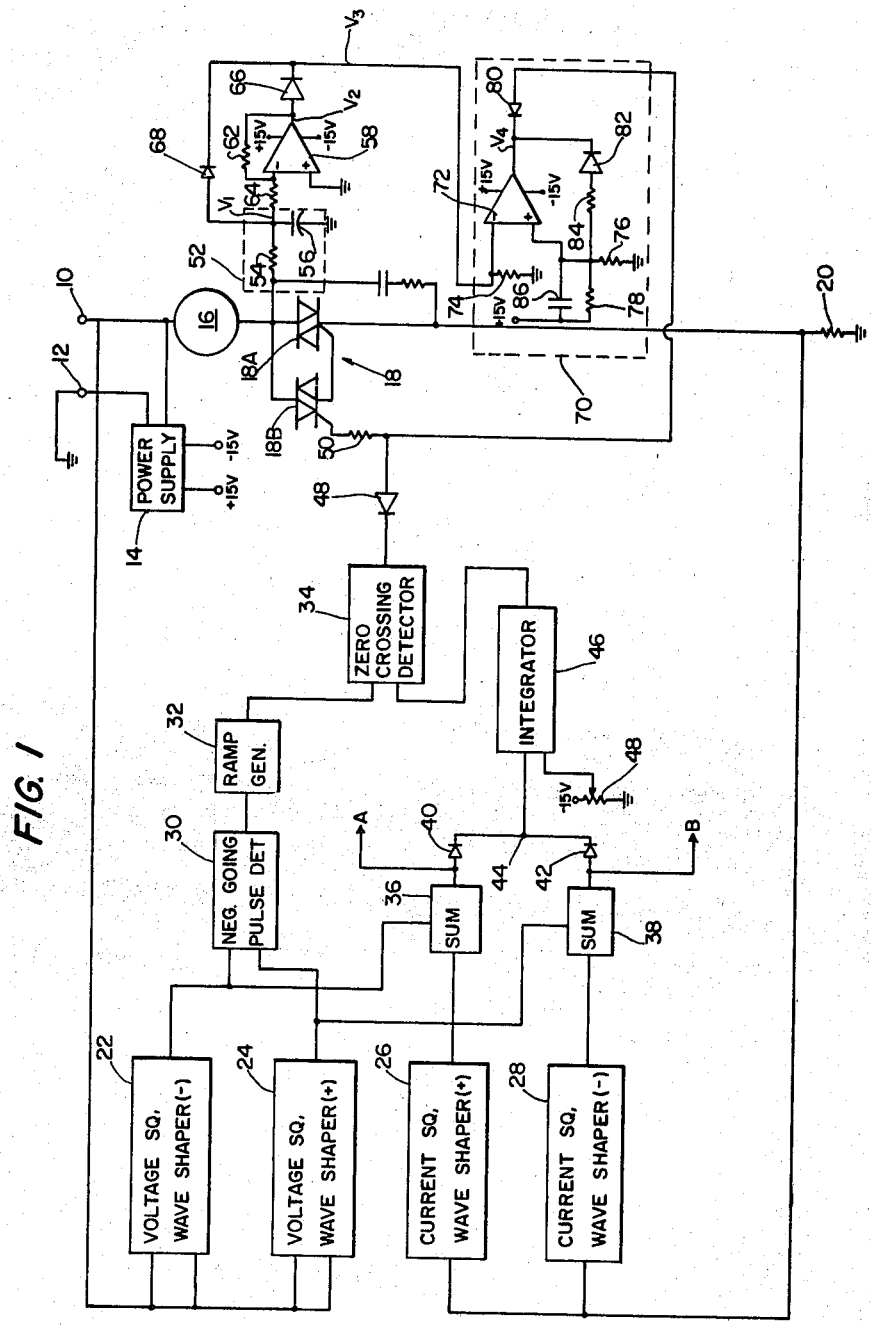
FIG. 1 is a schematic circuit diagram, partly in block form, of a first embodiment of the short circuit triac failure detection circuit of the invention as incorporated in a power factor controller system.

Referring to FIG. 1, the system shown therein includes input terminals 10 and 12 which are connected to a power supply circuit 14 and across the series combination of the winding or windings of a motor 16, a thyristor (triac) 18A and a current sensing resistor 20. Triac 18A is connected to a pilot triac 18B and the two triacs are turned on and off together; thus, for sake of convenience the two triacs 18A, 18B will be referred to collectively as triac 18. The input terminal 10 is also connected to positive and negative voltage squaring circuits 22 and 24 which produce respectively oppositely phased, full wave, rectangular wave outputs. A signal voltage is developed across current sensing resistor 20 which is applied to the inputs of full wave current squaring wave shapers 26 and 28. Wave shaper 26 is responsive only to positive half cycles of the current waveform and produces a first rectangular output waveform. Wave shaper 28 is responsive only to negative half cycles of the current waveform and produces a second rectangular output waveform out of phase with that produced by wave shaper 26.

The outputs of voltage squaring wave shapers 24 and 22 are connected to a negative going pulse detector 30 which produces negative spikes used in triggering a ramp generator 32 connected to the output of detector 30. The output of ramp generator 32 is connected to one input of a zero crossing detector 34. A control signal to be described below is connected to the negative zero crossing detector 34.

The control signal referred to above is a function of (i) a pulse signal based on the phase difference between the current and voltage applied to motor 16 and (ii) a command or reference signal to be described below. The phase difference signal is derived by a selected combination of the outputs of shapers 22, 24, 26 and 28.

Specifically, the outputs of shapers 22 and 26 are summed in a summing circuit or summer 36 and the outputs of shapers 24 and 28 are summed in a summer 38. The signals so produced are rectified by diodes and summed at a summing point 44 to provide corresponding output pulses. These output pulses are produced at the leading and trailing edge of the input A.C. voltage waveform and are of a constant amplitude and variable width, the width or duration of the pulses of being dependent on the phase difference between the input voltage and current. This pulse signal is applied to an integrator 46.

The command signal referred to above is derived from a potentiometer 48 which is set with motor 18 unloaded and, as explained in U.S. Pat. No. 4,266,177 referred to above, provides a selected power factor or phase angle between current and voltage as determined by the greatest power factor (smallest motor current-voltage phase difference) at which the motor will operate for the loading range to be encountered.

The output of integrator 46 is the control signal referred to above and is, as stated, connected to the second input to zero crossing detector 34. The output of zero crossing detector 34 is connected through a diode 48 and a current limiting resistor 50 to pilot triac 18B to control the turning on and turning off of triacs 18A, 18B.

The circuitry described thus far is similar to that disclosed in U.S. Pat. No. 4,266,177 and reference is made to that patent for further details of that circuitry and the operation thereof. The failure or fault detecting circuitry provided in accordance with the preferred embodiment of the present invention shown in FIG. 1 includes a low pass filter 52 formed by a resistor 54 and a capacitor 56 connected to the inverting (negative) input of an operational amplifier 58. Amplifier 58 provides a gain of minus one ($-1$) as fixed by a pair of resistors 62 and 64, which are of equal value. A diode 66 blocks the negative voltage of amplifier 58 while a further diode 68 directly applies the output voltage $V_1$ of filter 52 to the inverting input of a comparator stage 70 comprising an operational amplifier 72. The comparator 70 serves to sense when the input voltage $V_3$ is positive and is connected to triac 18 so as to turn on and hold triac 18 full on, responsive to such an occurrence. Comparator 70 also includes a resistor 74 which serves merely to supply input bias current to the comparator and a voltage divider formed by resistors 76 and 78 which determine the voltage at the at the non-inverting (positive) input of operational amplifier at predetermined value, typically +2 volts. A blocking diode 80 functions to block positive voltage at the output of operational amplifier 72. A further blocking diode 82 blocks application of positive voltage to the non inverting (positive) input of amplifier 72. A resistor 84 is connected in series with diode 82 and a charging capacitor 86 is connected between the positive (+15 volt) input terminal and the positive input of operational amplifier 72.

Figure 2A:
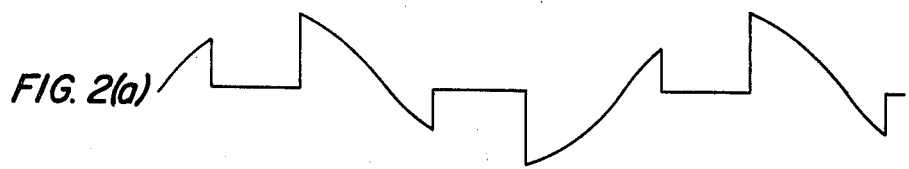
FIGS. 2(a) to 2(f) are waveforms associated with operation of the system of FIG. 1.
Figure 2B:
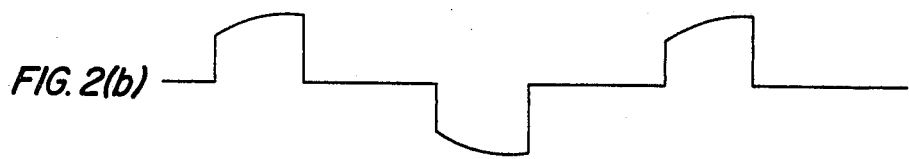

Considering the operation of the circuit shown in FIG. 1 with particular emphasis on the failure detection circuit of the invention, the voltage waveform across partially loaded motor in a normally operating power factor controller is typically as shown in FIG. 2(a). Consequently, the voltage across triac 18 is near zero volts when the triac is conducting and is equal to the line voltage when the triac 18 is turned off, as is illustrated in FIG. 2(b). It is this voltage which is sensed and passed through low pass filter 52 and as long as the operation is normal, the triac voltage is symmetrical and the output, $V_1$, of low pass filter 52 is near zero volts.

Figure 2C:
Figure 2D:
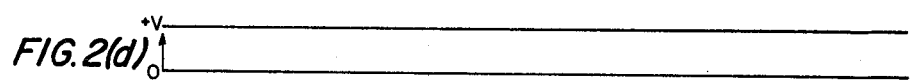

Considering the condition wherein the triac 18 is shorted in a negative direction, the triac voltage will be as shown in FIG. 2(c) and the filter output voltage $V_1$ will become a continuous positive value, V, as shown in FIG. 2(d). When $V_1$ is positive, the output voltage, $V_2$, of inverting amplifier 58 is negative and is blocked by diode 66. However, a positive $V_1$ is passed directly through diode 68 to the input of comparator 70.

Figure 2E:
Figure 2F:
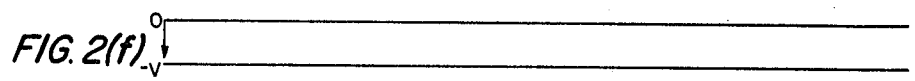

On the other hand, if triac 18 fails due to a short in the positive direction, the triac voltage is as indicated in FIG. 2(e) and the filter output voltage $V_1$ assumes a continuous negative value as shown in FIG. 2(f). This negative voltage is blocked by diode 68 but is inverted by inverting amplifier 58, resulting in a positive output voltage $V_2$. This voltage is passed by diode 66 and a positive input voltage $V_3$ is applied to comparator 70.

It will be seen from the discussion above that the input voltage $V_3$ to comparator 70 will have a near zero value when the triac 18 is operating normally and has a positive value if the triac 18 shorts out in either the positive or negative direction. The value of $V_3$ is fixed by the RC components shown and is typically +10 volts when the triac 18 is in a failed condition.

As stated above, the function of comparator 70 is to sense when voltage $V_3$ is positive and, responsive thereto, to turn on triac 18 and hold triac 18 full on. Considering the normal operation of comparator 70, under normal conditions the input voltage $V_3$ is zero and thus the inverting input of operational amplifier 72 is at zero volts. The voltage at the non-inverting input (typically +2 volts as discussed above) causes the output, $V_4$, of amplifier 72 to be at its full positive value (+15 volts in the exemplary embodiment under consideration). This positive voltage is blocked by diode 82 and thus has no effect on the bias voltage at the non-inverting input of amplifier, and by diode 80 and thus has no effect at the operation of triac 18.

As described above, if either the main triac 18A or the pilot triac 18B fails in a shorted mode in either a positive or negative direction, the voltage $V_3$ assumes a positive DC level greater than the reference voltage ($\pm 2$ volts) at the positive input of operational amplifier 72. This condition causes the output of amplifier 72 to switch to its full negative output ($-15$ volts in the specific embodiment under consideration). Gate current for triac 18 now flows continuously through diode 80 and current limiting resistor 50, turning triac 18 full on in both directions and the motor 16 reverts to normal operation as if connected directly across the line. Under these conditions, the voltage across triac 18 is symmetrical and the comparator input voltage $V_3$ goes to zero volts. However, since the output of comparator 70 is now negative, there will be current flow from ground through resistors 76 and 84 and diode 82 to amplifier 72. The ohmic value of resistor 84 is smaller than that of resistor 78 so that the net voltage at the positive input of amplifier 72 will now be negative and will serve to latch amplifier 72 into a negative output condition, thereby ensuring that motor 16 remains in the normal operating mode until the failed triac is replaced. When power is reapplied to the circuit, the positive charging current through capacitor 86 ensures that the output of amplifier 72 goes to the full positive value thereof for the unfailed mode of operation.

Figure 3:
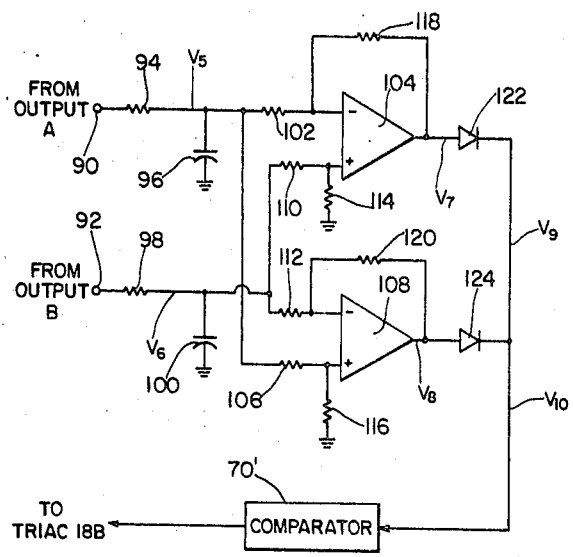
FIG. 3 is a schematic circuit diagram, partly in block form, of a second embodiment of the short circuit triac failure detection circuit of the invention.
Figure 4A:
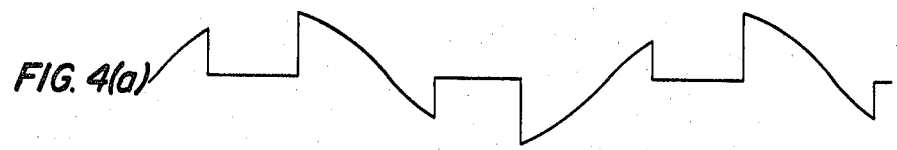
FIGS. 4(a) to 4(h) are waveforms associated with the circuit of FIG. 3.
Figure 4B:
Figure 4C:
Figure 4D:
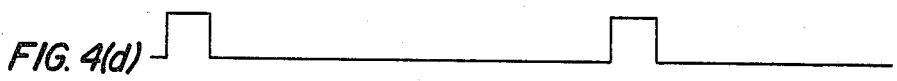

Referring now to the embodiment of FIG. 3, and by way of introductory explanation to FIGS. 4(a) to 4(h) which illustrate waveforms associated with the operation of basic overall power factor controller system of FIG. 1 and with the circuit of FIG. 3, the voltage and current waveforms associated with a lightly loaded motor controlled by a power factor controller system such as described above are shown in FIGS. 4(a) and 4(b). In the system shown in FIG. 1 and described in more detail in U.S. Pat. No. 4,266,177 referred to above, squaring of these waveforms and the inverses thereof (by wave shapers 22, 24, 26 and 28 of FIG. 1) and selectively summing the resultant outputs (by summing circuits 36 and 38 of FIG. 1) produces a first square wave having a pulse width or duration proportional to the phase shift for a positive half cycle of current (shown in FIG. 4(c)) and a second square wave with a pulse width or duration proportional to the phase shift for a negative half cycle of current. The average d.c. values of the waveforms shown in FIGS. 4(c) and 4(d) could be obtained by passing each through a low pass filter (not shown) and would be equal for normal triac operation.

Figure 4E:
Figure 4F:
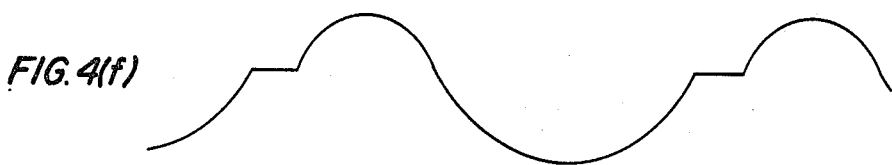
Figure 4G:
Figure 4H:

Under conditions where the triac 18 of FIG. 1 is shorted in the negative direction only, the motor current and voltage waveforms would be as shown in FIGS. 4(e) and 4(f). The waveforms proportional to the phase angles (i.e., corresponding to FIGS. 4(c) and 4(d)) are shown in FIGS. 4(g) and 4(h), with the unequal widths shown in these latter figures resulting in unequal average d.c. levels. In general, the circuit of FIG. 3 is employed in a failure mode to sense the unequal d.c. levels and in response thereto, to turn the triac full on in both directions.

Referring to FIG. 3, the voltage waveforms proportional to phase angle (derived from summing circuits 36 and 38 of FIG. 1 and appearing at outputs A and B) are applied to input terminals 90 and 92 of FIG. 3. The input at terminal 90 is filtered by a low pass filter formed by a resistor 94 and a capacitor 96 to produce a first voltage $V_5$ and by a low pass filter formed by a resistor 98 and a capacitor 100 to produce a second voltage $V_6$. The voltage $V_5$ is fed through a resistor 102 to the inverting (negative) input of a first operational amplifier 104 and through a resistor 106 to the non-inverting (positive) input of a second operational amplifier 108. Similarly, voltage $V_6$ is fed through a resistor 110 to the non-inverting input of amplifier 104 and through a resistor 112 to the inverting input of amplifier 108. Reference input voltage resistors 114 and 116 are provided for amplifiers 104 and 108, respectively, and feedback resistors 118 and 120 are connected between the respective outputs and inverting inputs of the two amplifiers. Blocking diodes 122 and 124 are provided at the respective outputs.

The output voltages $V_7$ and $V_8$ of amplifiers 104 and 108 are connected to a comparator 70' which corresponds to comparator 70 of FIG. 1 and which controls the operation of a corresponding triac.

Operational amplifiers 104 and 108 each have a finite gain and both have signals of equal magnitude but opposite polarity applied to the inverting and non-inverting inputs thereof. Thus, when triac operation is normal, voltage $V_5$ equals voltage $V_6$, and both output voltages $V_7$ and $V_8$ are near zero.

Considering the operation of the circuit of FIG. 3 when the triac controlled thereby fails in the negative direction (resulting in waveforms corresponding to those shown in FIGS. 4(g) and 4(h)), the average d.c. voltage level of voltage $V_6$ will be greater than that for $V_5$. Because voltage $V_6$ is fed to the positive input of amplifier 104 and to the negative input of amplifier 108, the voltage output, $V_7$, of amplifier 104 goes to a positive voltage (typically 10 volts due to the finite gain chosen) and the output, $V_8$, of amplifier 108 goes negative. The positive voltage, $V_7$, is passed by diode 122 and fed to the input of comparator 70' while the negative voltage $V_8$ is blocked by diode 124.

Under conditions where the triac fails in a positive direction, the width of the pulses of FIG. 4(g) would be greater than that for the pulses of FIG. 4(h) (i.e., the situation will be the opposite of that actually illustrated) and voltage $V_5$ would be greater than voltage $V_6$. Under this circumstance, the output, $V_8$, of amplifier 108 would be positive (again, typically 10 volts) and the output, $V_7$, of amplifier 104 would go negative. The positive voltage is passed by diode 124 and the negative voltage is blocked by diode 122, the former voltage being fed to comparator 70'.

It will be seen from the foregoing that the input, $V_{10}$, to comparator 70' is zero when the triac operation is normal and goes to a positive value of, typically, plus 10 volts when the triac fails in either the positive or negative direction. In the event of triac failure, the comparator 70' functions the same as comparator 70 of FIG. 10 to turn the triac full on in both directions, and as a result, the phase shift again becomes symmetrical causing $V_{10}$ to be zero.

Figure 5:
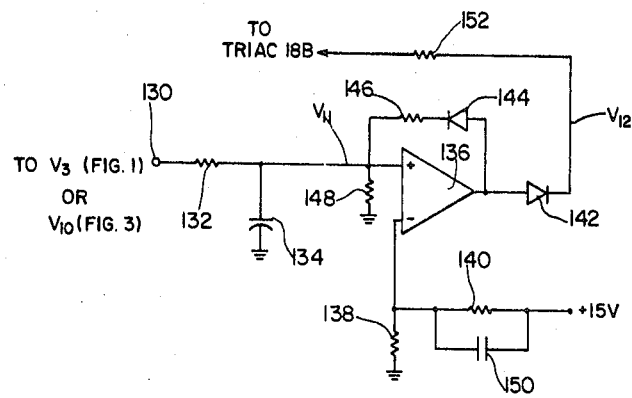
FIG. 5 is a schematic circuit diagram of a preferred embodiment of the open circuit triac failure detection circuit of the invention.

Referring to FIG. 5, an embodiment of the invention is shown which is adapted to be used with either of the embodiments of FIG. 1 or FIG. 3 in order to provide fault protection in a failure mode when the triac open circuits in one direction only. In the embodiment of FIG. 1, the voltage across triac 18 becomes non-symmetrical in the event of an open circuit in either direction, resulting in a waveform similar to that of FIG. 2(c). Such a waveform will cause of voltage $V_3$ of FIG. 1 to go to approximately plus 10 volts, regardless of the direction of failure. With the embodiment of FIG. 3, the current will become non-symmetrical in the event of an open circuit in either direction, resulting in waveforms similar to those shown in FIGS. 4(g) and 4(h). Again, this will cause the comparator input voltage to go to approximately plus 10 volts, regardless of the direction of failure. Under both conditions, the positive voltage will trigger the comparator (70 or 70') which attempts to turn the triac full on as previously described. However, under open circuit failure conditions and in the absence of the circuit of FIG. 5, the open circuit will remain and the input waveforms will be described previously.

The open circuit failure detecting circuit of FIG. 5 includes an input terminal 130 to which is applied either the voltage $V_3$ of the embodiment of FIG. 1 or the voltage $V_{10}$ of the embodiment of FIG. 3. Terminal 130 is connected to a low pass filter formed by a resistor 132 and a capacitor 134. The time constant of the low pass filter is typically 1 to 2 seconds which is about 20 times longer than 50 to 100 milliseconds required for the comparator (70 or 70') to respond. The filter output is connected to the positive input of an operational amplifier 136, connected as a comparator. A bias or reference input voltage developed by resistors 138 and 140 is connected to the negative input of amplifier 136. In a specific example, this bias voltage is approximately +2 volts and thus the output voltage, $V_{12}$, of amplifier 136 is normally at the full negative value thereof. A first blocking diode 142 blocks the negative voltage $V_{12}$ from the remainder of the circuit while a second blocking diode 144 blocks feedback of this voltage through a resistor 146 to the positive input of amplifier 136. A further resistor 148 serves to provide bias current for amplifier 136 and a charging capacitor 150 is connected across input resistor 140. The output of amplifier 136 is connected through diode 142 and a current limiting resistor 152 to the gate of the triac being controlled (corresponding to triac 18 of FIG. 1).

It will be seen from the foregoing that, under normal conditions, the circuit of FIG. 5 has no effect on the overall operation of the power factor controller since the negative output produced under these conditions is blocked by diodes 142 and 144. However, if the triac suffers an open circuit failure, the output of comparator 70 or 70' goes to the full negative value thereof in response the non-symmetrical input signal produced under these conditions but cannot correct the problem and thus the input voltage $V_{11}$ continues to increase. When this voltage reaches a value greater than the input voltage at the negative input of comparator 136 (+2 volts in the example being considered), the output comparator 136 switches, i.e., becomes positive. This positive voltage is fed through diode 142 and resistor 152 to the gate circuit of the triac. The value of resistor 152 is equal to that of the gate current limiting resistor (resistor 50 in FIG. 1) and thus the voltage at the gate of the triac is essentially zero volts, thereby resulting in no gate current flow. This turns the triac 18 completely off. Further, under these circumstances, the current and voltage waveforms are once again symmetrical and the voltage $V_3$ (FIG. 1) or $V_{10}$ (FIG. 3) goes to zero. However, the resultant positive output voltage is now fed back through diode 144 and resistor 146 to the positive input of comparator amplifier 136 and holds amplifier 136 in a positive output latched condition. Amplifier 136 will remain in this condition until the circuit is de-energized and the failure is corrected. Upon re-energizing the circuit, charging current will be provided through capacitor 150 to ensure that operational amplifier 136 resumes the normal, negative output condition thereof.

Although the invention has been described in relation to exemplary embodiments thereof, it will be understood by those skilled in the art that variations and modifications can be effected in these exemplary embodiments without departing from the scope and spirit of the invention.

I claim:

1. In a triac control system for controlling current flow to a load, a triac failure detection circuit for detecting a unidirectional short circuit failure of the triac control system, said failure detection circuit comprising detecting means for detecting the triac voltage waveform and for producing a first output responsive to a symmetrical triac voltage waveform produced during normal triac operation and for producing a second output responsive to a non-symmetrical triac voltage waveform caused by failure of said triac in either a positive or negative direction; and control means, connected to said detecting means, for turning said triac full on in both directions responsive to said second output.

2. A system as claimed in claim 1 wherein said load comprises a induction motor and said control system comprises a power factor controller for controlling the power fed to said motor.

3. A system as claimed in claim 1 or claim 2 wherein the detecting means comprises a low pass filter, connected to receive the voltage across the triac, which produces a first filter output responsive to short circuiting of said triac in one direction and which produces a second filter output responsive to short circuiting of said triac in a second direction, and operational amplifier means connected to said low pass filter for producing said second output responsive to either said first filter output or said second filter output.

4. A system as claimed in claim 3 wherein said operational amplifier means comprises an operational amplifier, a first blocking diode connected between the output and one input of said operational amplifier and a second blocking diode connected between said operational amplifier and said triac control means.

5. A system as claimed in claim 1 wherein said control means comprises an operational amplifier having one input connected to the output of said detecting means and an output connected to the gate of said triac.

6. A system as claimed in claim 5 wherein said control means further comprises bias circuit means for providing a predetermined bias voltage at the other input of said operational amplifier, said bias voltage being related to second output such that said operational amplifier switches to a full output condition when a predetermined relationship exists between said bias voltage and said second output, said control means further comprising latching circuit means, responsive to said switching of said operational amplifier, for latching said operational amplifier in said full output condition so as to ensure that said triac is continuously maintained fully turned on in both directions.

7. A system as claimed in claim 6 wherein said latching circuit means includes a resistor and diode connected between said bias circuit means and the output of said operational amplifier.

8. A system as claimed in claim 1 wherein said system further comprises open circuit failure detecting means for detecting an open circuit failure of said triac in either direction and for turning off said triac in response to detection of such a failure.

9. A system as claimed in claim 8 wherein said open circuit failure detecting means comprises an operational amplifier, connected to receive the first and second outputs of said detecting means of said failure detection circuit, for producing an output which causes turning off of said operational amplifier when said first output is received and for passing the output of said operational amplifier to the gate of said triac when said second output is received.

10. A system as claimed in claim 9 further comprising an input low pass filter connected to the input of said operational amplifier which receives the first and second outputs of said detecting means and latching circuit means for latching said operational amplifier in the output condition thereof which provides for turning off of said triac.

11. In a triac control system for an alternating current input signal for controlling input current flow to an inductive load, a triac failure detection circuit for detecting a unidirectional short circuit failure of the traic of the control system, said failure detection circuit comprising phase shift detection means for deriving first and second pulse trains of phase difference pulses whose phase durations are proportional to the phase differences between the triac voltage and current for each half cycle of said alternating current signal, and detecting means for receiving said phase difference pulses and for producing a first output when the half cycle pulses are of equal duration corresponding to normal operation, and for producing a second output when the half cycle pulses are of unequal duration corresponding to a short circuit failure of said triac in either direction, and control means, connected to said detecting means, for turning said triac full on in both directions responsive to said second output.

12. A system as claimed in claim 11 wherein said load comprises an induction motor and said control system comprises a power factor controller for controlling the power supplied to said motor in accordance with the phase difference between motor voltage and current waveforms, and said phase shift detection means derives said phase difference signals from signals produced by said power factor controller.

13. A system as claimed in claim 12 wherein said power factor controller produces first and second signals proportional the square of to the load voltage and the inverse thereof and third and fourth signals proportional to the square of the load current and the inverse thereof, and includes summing means for selectively summing said signals to produce a first square wave having a pulse duration proportional to the phase shift for a positive half cycle of the input current and a second square wave having a pulse duration proportional to the phase shift for a positive half cycle of the input current and a second square wave having a pulse duration proportional to the phase shift for a negative half cycle of the input current, said first and second square pulse trains produced by said phase shift 14. A system as claimed in claims 11, 12 or 13 wherein said detecting means includes first and second operational amplifiers for receiving one of said first and second pulse trains at each of the inputs thereof such that an output is produced when the pulses of the first and second pulse trains are of unequal duration.

15. A system as claimed in claim 14 further comprising blocking diode means for blocking the outputs of a first polarity produced by either of said operational amplifiers.

16. A system as claimed in claim 11, wherein the said control means comprises an operational amplifier having one input connected to the output of said detecting means and an output connected to the gate of said triac.

17. A system as claimed in claim 16 wherein said control means further comprises bias circuit means for providing a predetermined voltage at the other input of said operational amplifier, said operational amplifier switching to a full output condition when a predetermined relationship exists between said bias voltage and said second output, said control means further comprising latching circuit means responsive to said switching of said operational amplifier for latching said operational amplifier in said full output condition so as to ensure that said triac is continuously maintained fully turned on in both directions.

18. A system as claimed in claim 11 wherein said system further comprises open circuit failure detecting means for detecting an open circuit failure of said triac in either direction and for turning off said triac in response to detection of such a failure.

19. A system as claimed in claim 18 wherein, during normal operation of said system, said triac receives a control signal for turning said triac on and wherein said open circuit failure detecting means comprises an operational amplifier connected to receive the first and second outputs of said detecting means, diode means for blocking the output of said operational amplifier when said first output is received and for passing the output of said operational amplifier to the gate of said triac when said second output is received, the output of said operational amplifier as received at the gate of said triac being related to said control signal for said triac such that the resultant gate current provided at the gate of the triac is such as to turn the triac off.

20. A system as claimed in claim 19 further comprising an input low pass filter connected to the input of said operational amplifier which receives the first and second outputs of said detecting means and latching circuit means for latching said operational amplifier in the output condition thereof which provides for turning off of said triac.

* * * * *